(12) United States Patent
Barber et al.

(10) Patent No.: US 6,342,134 B1
(45) Date of Patent: Jan. 29, 2002

(54) METHOD FOR PRODUCING PIEZOELECTRIC FILMS WITH ROTATING MAGNETRON SPUTTERING SYSTEM

(75) Inventors: Bradley Paul Barber, Chatham, NJ (US); Ronald Eugene Miller, Riegelsville, PA (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/503,225

(22) Filed: Feb. 11, 2000

(51) Int. Cl.[7] .............................................. C23C 14/34
(52) U.S. Cl. ......................... 204/192.18; 204/192.13; 204/192.22; 204/192.3; 427/8; 216/38; 29/25.35
(58) Field of Search ....................... 204/192.12, 192.13, 204/192.18, 192.22, 192.3; 427/8; 216/38; 29/25.35

(56) References Cited

U.S. PATENT DOCUMENTS

| | | | |
|---|---|---|---|
| 4,642,163 A | * 2/1987 | Greschner et al. | 156/643 |
| 5,378,341 A | 1/1995 | Drehman et al. | 204/298.18 |
| 5,651,865 A | * 7/1997 | Sellers | 204/192.13 |
| 5,683,558 A | * 11/1997 | Sieck et al. | 204/192.12 |
| 5,693,197 A | 12/1997 | Lal et al. | 204/192.2 |
| 5,702,573 A | * 12/1997 | Biberger et al. | 204/192.12 |
| 5,830,327 A | 11/1998 | Kolenkow | 204/192.12 |
| 5,935,641 A | * 8/1999 | Beam, III et al. | 427/100 |
| 6,001,227 A | 12/1999 | Pavate et al. | 204/298.12 |

OTHER PUBLICATIONS

Vossen et al., "Thin Film Processes", pp. 48, Dec. 1978.*

* cited by examiner

Primary Examiner—Nam Nguyen
Assistant Examiner—Steven H. VerSteeg
(74) Attorney, Agent, or Firm—Lowenstein Sandler PC

(57) ABSTRACT

A quality-assurance method is described that is useful in the fabrication of piezoelectric films of electronic devices, particularly resonators for use in RF filters. For example, the method comprises determining the surface roughness of an insulating layer on which the piezoelectric film is to be deposited and achieving a surface roughness for the insulating layer that is sufficiently low to achieve the high-quality piezoelectric film. According to one aspect of the invention, the low surface roughness for the insulating layer is achieved with use of a rotating magnet magnetron system for improving the uniformity of the deposited layer. According to other aspects of the invention, the high-quality piezoelectric film is assured by optimizing deposition parameters including determination of a "cross-over point" for reactive gas flow and/or monitoring and correcting for the surface roughness of the insulating layer pre-fabrication of the piezoelectric film.

7 Claims, 4 Drawing Sheets

METHOD FOR PRODUCING PIEZOELECTRIC FILMS WITH ROTATING MAGNETRON SPUTTERING SYSTEM

RELATED APPLICATIONS

This application is related to U.S. patent application Ser. No. 09/502,868, now abandoned titled "Method for Producing Devices Having Piezoelectric Films," filed concomitantly herewith by inventors Bower, Pastalan, and Rittenhouse and assigned to the present assignee (hereinafter the "Bower application"), which is incorporated herein by reference.

FIELD OF THE INVENTION

The invention relates to a method for producing electronic devices containing a piezoelectric film comprising use of a rotating magnetron sputtering system. The invention is particularly useful in fabricating acoustic resonators and semiconductor devices.

BACKGROUND OF THE INVENTION

Communications systems typically include a variety of devices (e.g., filters, mixers, amplifiers, integrated circuits, and so forth). Communications systems are useful for transmitting information (e.g., voice, video, data) relayed by means of wireless links, twisted pair, optical fibers, and so forth. As wireless communications systems become more advanced, signals are being transmitted at higher frequencies (e.g., PCS, ISM, etc). As systems are continually developed in response to market pressures, the demand for increased performance and reduced size intensifies. Market forces demand increased integration and reduction of component size.

Resonators such as Bulk Acoustic Wave (BAW) resonators are important components in the fabrication of bandpass filters and other related semiconductor devices. The BAW resonator is a piezoelectric resonator that essentially comprises a film of piezoelectric material (e.g., a crystalline AlN film), deposited between at least two electrodes. Upon application of voltage to such a structure, the piezoelectric material will vibrate in an allowed vibrational mode at a certain frequency. Piezoelectric resonators are thus useful in discriminating between signals based on frequency diversity (e.g., a bandpass filter), and in providing stable frequency signals (e.g., as in a frequency stabilizing feedback element in an oscillator circuit).

Typically, the performance and resonant frequency of the piezoelectric resonator will depend upon the composition, thickness, and orientation of the piezoelectric material. The resonant frequency of a piezoelectric material is typically inversely proportional to its thickness; thus, for piezoelectric resonators to operate at high frequencies {e.g., frequencies greater than ~700 Megahertz (MHz) up to 10 Gigahertz (10 GHz)}, the thickness of the piezoelectric film must be reduced to a thin film (e.g., having a thickness ranging from about 500 nm to about 10 $\mu$m). The coupling between electrical and mechanical energy of a piezoelectric resonator is dependent on the crystalline orientation of the atoms comprising the piezoelectric film. The induced strain (i.e., stress wave) in a piezoelectric film in response to applied voltage (i.e., electric field) can only occur from the advantageous alignment of the crystalline axis within the piezoelectric film. An example of an advantageous film orientation is <002> of AlN perpendicular to the substrate.

Piezoelectric film quality may be affected by the method used to form the film. Typically, sputter deposition or reactive sputter deposition techniques have been used. Sputter deposition involves a vacuum deposition process in which a sputtering target is bombarded with ions, and the atoms of the target material are mechanically ejected from the target and deposited onto a nearby substrate. In reactive sputtering, a reactive gas is introduced into the deposition chamber and reacts with the target material to produce a film that is sputtered onto the substrate, either directly or upon further reaction with freed target material. In DC reactive sputtering, a direct current electrical potential is applied within the sputtering chamber in which a reactive sputtering process is carried out. However, typical sputtering and reactive sputtering techniques, including DC reactive sputtering, often do not provide adequate deposition rates. A pulse DC sputtering method for efficiently depositing thin films of piezoelectric materials such as aluminum nitride (AlN), e.g., with improved control over the direction and delivery of the reactive gas, is described in U.S. patent application Ser. No. 09/145,323, to Miller et al., "Pulse DC Reactive Sputtering Method for Fabricating Piezoelectric Resonators," filed Sep. 1, 1998, assigned to the present assignee and incorporated herein by reference. In Miller et al., the quality of the piezoelectric films is improved with the techniques used to deposit the films, i.e., the pulse width of the positive portion of the applied voltage is adjusted based on its effect on the desired film constituency, stress, and texture.

Magnetron sputtering systems are known in which magnetically-enhanced targets are used to confine the plasma discharge along a particular path and enhance the flow of target material. See, e.g., U.S. Pat. No. 5,830,327 to Kolenkow, "Methods and Apparatus for Sputtering with RotatingMagnet Sputter Sources"; U.S. Pat. No. 5,693,197 to Lal et al., "DC Magnetron Sputtering Method and Apparatus": and U.S. Pat. No. 5,378,341 to Drehman et at, "Conical Magnetron Sputter Source," all of which are incorporated herein. Use of magnetron sputtering has been problematic, however, for depositing silicon dioxide films. Because silicon dioxide is a good insulator, a film sufficiently thick to cause arcing problems is rapidly formed at certain areas of the target, i.e., splats or regions of silicon dioxide may be deposited on the target surface so that it is not uniformly biased, and eventually, the target may become coated to the point where it is no longer conductive and the deposition may stop. Thus, magnetron reactive sputtering has not been conventionally used to deposit quality silicon dioxide films. See, e.g., U.S. Pat. No. 5,683,558 to Sieck et al., "Anode Structure for Magnetron Sputtering Systems," at col. 1, lines 53–55 ("The arcing associated with silicon dioxide has prevented planar magnetron reactive sputtering from being efficiently utilized to deposit quality silicon dioxide films"). Additionally, previous methods of depositing insulating films (including piezoelectric films) have involved use of RF sputtering utilizing fixed magnets.

As may be appreciated, those in the field of communications systems and components continue to search for new methods for increasing system performance and integration. In particular, it would be advantageous to provide new methods for improving the quality of piezoelectric films. A high-quality AlN piezoelectric film deposited on a reflecting multi-layer acoustic mirror stack is a method to produce high-quality, RF front-end filters for GHz applications. These objectives and further advantages of this invention may appear more fully upon considering the detailed description given below.

SUMMARY OF THE INVENTION

Summarily described, the invention embraces a quality-assurance method for use in the fabrication of piezoelectric films for electronic devices, particularly resonators. The method comprises determining the surface roughness of an insulating layer on which the piezoelectric film is to be deposited and achieving a surface roughness for the insulating layer that is sufficiently low to achieve the high-quality piezoelectric film. According to one aspect of the invention, the low surface roughness for the insulating layer is achieved with use of a rotating magnet magnetron system for improving the uniformity of the deposited layer. According to other aspects of the invention, the high-quality piezoelectric film is assured by optimizing deposition parameters or monitoring and correcting for the surface roughness of the insulating layer pre-fabrication of the piezoelectric film.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale.

DETAILED DESCRIPTION OF THE INVENTION

Although specific features and configurations are discussed below, it should be understood that these examples are for purposes of illustration only. One skilled in the relevant art will recognize that other steps, configurations and arrangements may be used without departing from the spirit and scope of the invention.

Figure 1:
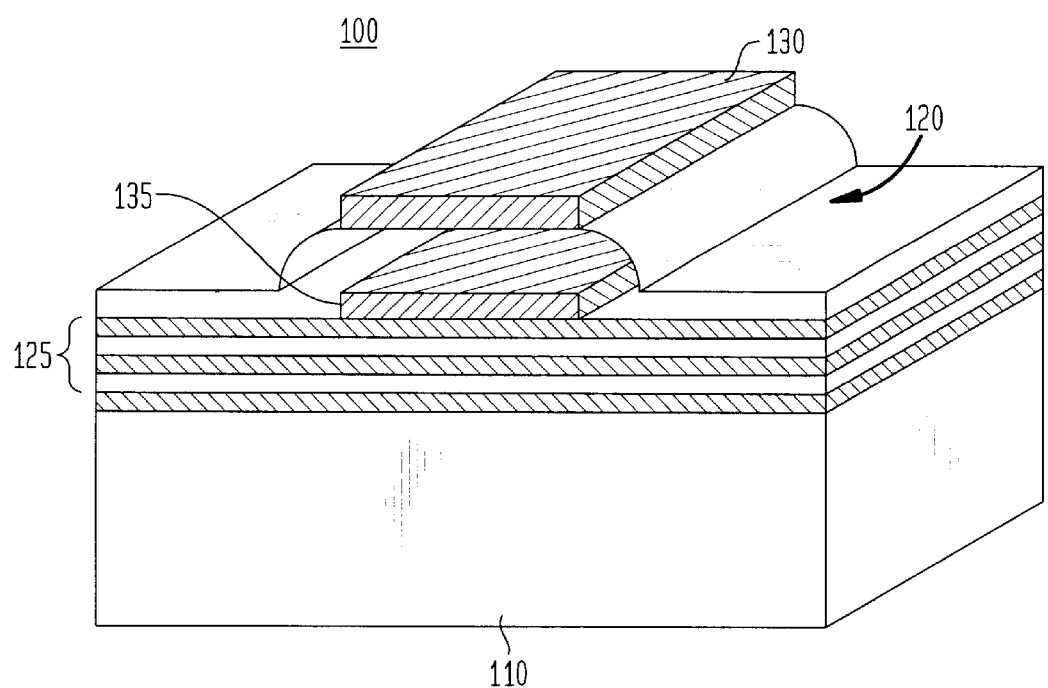
FIG. 1 is a perspective schematic illustration of an acoustic resonator.

The invention pertains to a method for obtaining high-quality piezoelectric films. FIG. 1 is a perspective schematic illustration of an acoustic resonator, which may be fabricated using the inventive method. The resonator 100 comprises a substrate 110, a film or layer 120 of piezoelectric material, and a means for retaining acoustic energy in the piezoelectric film, such as a Bragg reflecting region 125, between the substrate 110 and film 120. Alternative to the reflecting region 125, a layer of air (not shown) may be used to suspend the film 120 above the substrate 110. A bottom electrode 135 and top electrode 130 are disposed on opposite surfaces of the piezoelectric film 120.

The layer of piezoelectric material advantageously comprises AlN, but may be made of any suitable material that has piezoelectric qualities sufficient for the particular resonator application. Typical piezoelectric materials include, for example, quartz, zinc oxide (ZnO), and ceramic materials such as lithium niobate ($LiNbO_3$), lithium tantalate ($LiTaO_3$), paratellurite ($TeO_2$), and lead titanate zirconate (PZT). The substrate typically is comprised of silicon but may be fabricated with other materials such as quartz, sapphire, polysilicon, aerogel, and aluminum oxide ($Al_2O_3$). Advantageously, with the invention, the electrodes and particularly the bottom electrode 135 may comprise aluminum (Al) or a metal stack using titanium and Al. Besides use of Al and/or Ti/Al, other metals having a low sheet resistance and low surface roughness may be used for fabricating the electrodes 130, 135. Previous stacked metal electrodes often have comprised Ti/TiN/Al as the composition of choice.

Notably, it would be advantageous to non-destructively predict and assure the quality of the piezoelectric film 120 before the film is deposited. Traditionally, methods for determining the quality of the piezoelectric films have been applied after the piezoelectric films 120 are deposited (e.g., X-ray diffraction) but these methods may destroy or damage the devices. Additionally, it would be advantageous to avoid use of collimated metals (i.e., metals deposited with a collimator) in order to eliminate film thickness non-uniformity associated with collimated depositions. To avoid such non-uniformities, this invention provides an inventive process to produce a high-quality piezoelectric film without use of the collimator. The inventive method is advantageous in that high-quality piezoelectric films can be fabricated when there is a decrease in the process window for depositing textured Ti—Al, and the quality of the piezoelectric film can be assured pre-fabrication, i.e., before the piezoelectric film is deposited. This is accomplished by fabricating insulating layers 125 having a surface roughness that is sufficiently low to assure the high-quality piezoelectric film (e.g. <10 Å), non-destructively evaluating these layers, and further smoothing them, if necessary. This method also reliably predicts the quality of the piezoelectric film before it is deposited.

According to one aspect of the invention, a process involving use of rotating magnet magnetrons and pulsed DC power supplies is applied to deposit the insulating layers and/or piezoelectric film. Rotating magnet magnetrons are used to provide film thickness uniformity, and such rotating magnet magnetrons are made possible in that process parameters are optimized to achieve a high deposition rate and correct index of refraction. According to another aspect of the invention, the process comprises determination of a "cross-over point" such that the target will remain effective in emitting atoms and resisting the deposition of materials thereon. The "cross-over point" is defined as the point at which a pressure increase in the chamber 210 (see FIG. 2) becomes non-linear with the flow of reactive gasses, and is further defined below. Additionally, the process makes use of the recognition that the quality of the piezoelectric film can be improved by addressing the surface roughness of the layers on which the piezoelectric film is deposited, i.e., providing an underlying insulating layer having a relatively smooth surface produces a higher quality piezoelectric film. Thus, according to another aspect of the invention, the surface roughness of the insulating layers are monitored and smoothed, if necessary, before the piezoelectric film is deposited.

Notably, the contemporaneously-filed Bower application referenced above (which is assigned to the present assignee and incorporated herein), describes the recognition that the surface roughness of the electrode underlying the piezoelectric film (FIG. 1, 135) affects the quality of the piezoelectric film 120. The Bower application thus describes a method of making a device having a piezoelectric film comprising controlling the surface roughness of the metal layer, which may include controlling the surface roughness of the insulating layers 125 underlying the metal layer 135. The Bower method comprises use of textured titanium (and a collimator in the deposition process), which increases the system tolerance or process window for surface roughness. In other words, when the collimator is used, the insulating layers 125 do not have to be as smooth as when the collimator is not used in order to achieve a high-quality piezoelectric film. The collimator also is known, however, for decreasing the thickness uniformity of the titanium layer.

With this invention, a process is described for minimizing the surface roughness of the underlying insulating layers on which the electrode and piezoelectric films are deposited, and with the instant method, the use of a collimator is not required. The surface roughness of the underlying layers 125 may be reduced to achieve a maximum texture for the piezoelectric films and optimal operation. of the resonator. For example, the insulating. layers should be fabricated so they have root mean square (RMS) morphology reflecting a surface roughness of about less than 10 Angstroms. The RMS value reflects a true average, absolute value for the deviation or difference in the surface morphology from a mean value of zero, the value of zero reflecting a completely smooth surface. The RMS value is defined by the square root of the difference between the mean square and the square of the mean, or in other words, it is the normalized average value of the roughness relative to the median of the measured roughness.

A "high-quality" piezoelectric film is defined herein as a film having a texture reflecting a good crystalline orientation of atoms, low stress (less than about 50 megaPascals {MPa}), and appropriate index of refraction (approximately 2.0, more preferably 2.07±0.005, and more preferably 2.078±0.005). Film thickness uniformity advantageously is 0.4% one Sigma, with a more preferred thickness uniformity of 0.2% one Sigma, with an even more preferred thickness uniformity of 0.1% three Sigma. Thus, the "quality" of a piezoelectric film as that term is used herein relates to at least one of the texture, stress, uniformity, and/or index of refraction of the piezoelectric film. The term "texture" as used herein is intended to describe the crystallographic alignment of grains in a polycrystalline film wherein "maximum texture" denotes a film having an alignment (orientation) of grains centered about a single direction at an angle subtended from (relative to) the growth direction. The texture and thus quality of the piezoelectric film can be defined by reference to its "rocking curve." More specifically, ideally crystallographic directions of the grains are centered about a single direction; as mentioned above, the performance of the piezoelectric film (e.g. in a piezoelectric resonator), is dependent upon the crystalline orientation of the atoms comprising the film. Typically, however, there will be a gaussian distribution of directions about which the grains are centered. The smaller the distribution, the closer the film is to maximum texture. The distribution of grain directions may be plotted to define a peak, and the width of the peak at half its maximum height (full-width at half maximum) (FWHM), i.e., the "rocking curve" width, reflects a value for defining the quality of the film texture. The "rocking curve" width is thus the figure of merit for the film texture, i.e., the smaller the distribution, the smaller the rocking curve, and the closer the film is to maximum texture. The piezoelectric film advantageously is formed with a FWHM rocking curve of less than 3.5°, with a more preferred low rocking curve being less than about 2.5°, and more preferably less than 1.5° (FWHM).

Figure 2:
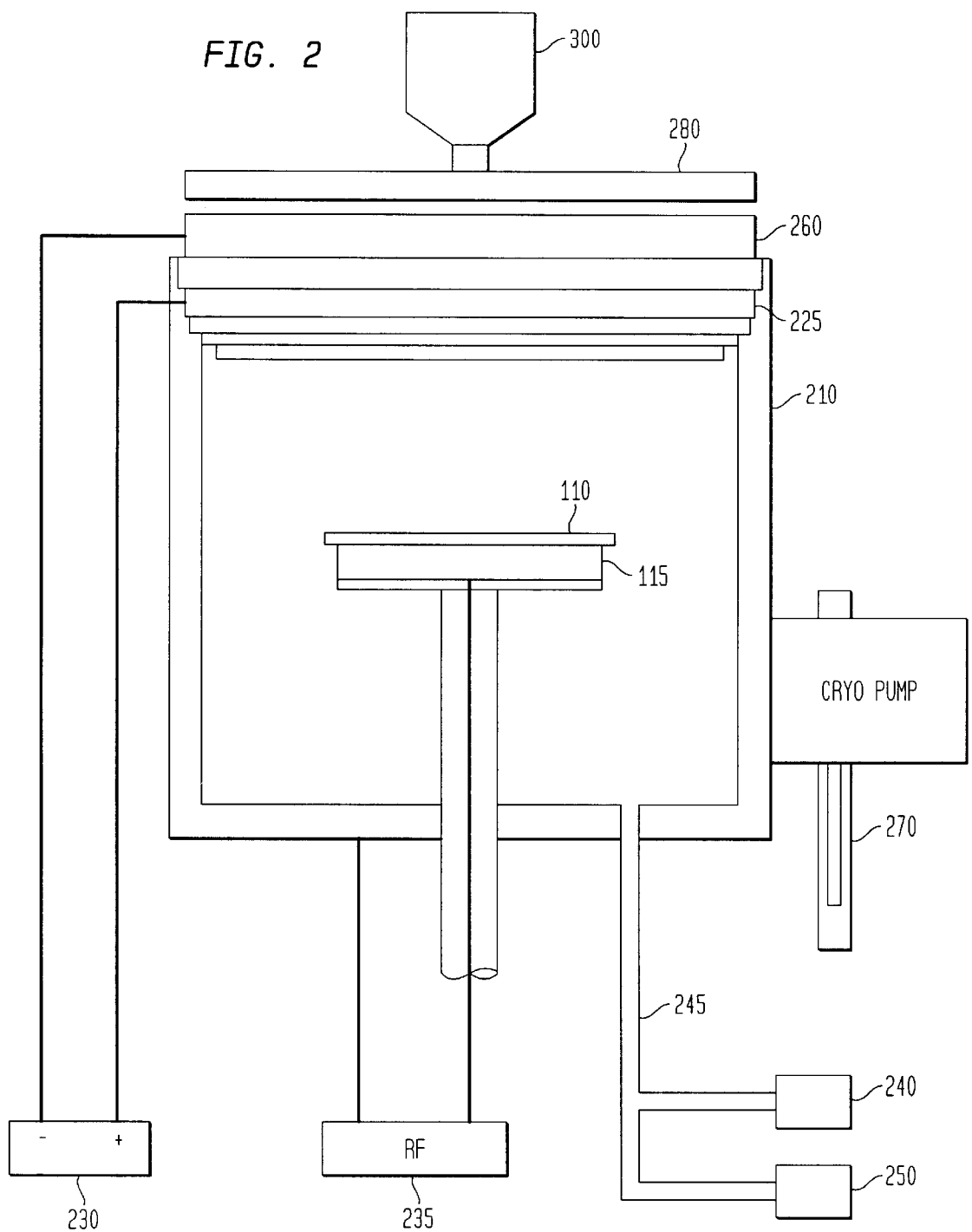
FIG. 2 is a schematic diagram of a reactive sputtering arrangement with rotating magnetrons for use in performing the inventive method.

According to one aspect of the invention, a high-quality piezoelectric film may be fabricated by applying a rotating magetron and pulse DC reactive sputtering process to fabricate one or more layers of the piezoelectric device, including the insulating layers (FIG. 1, 125), and/or the piezoelectric film (FIG. 1, 120). FIG. 2 is a simplified, schematic representation of a rotating magnetron sputtering apparatus for use in depositing the piezoelectric 120, the insulating layers 125, and the electrodes 130, 135 on the substrate 110. The apparatus includes a chamber 210 (e.g., a plasma chamber), and a pair of electrodes (the target 260 and anode ring 225) within the chamber. The electric potential applied to the electrodes may be controlled by a pulsed DC power source 230 or other suitable source. Various sources are provided for injecting gases into the chamber. A first flow control source 240 injects noble gases into the chamber (e.g., Ar, Ze, and Kr), and a second flow control source 250 supplies a reactive gas ($O_2$, $N_2$, etc.) into the chamber 210. The gases are supplied via gas delivery port 245.

A target material is positioned within the sputtering chamber. The substrate 110 is also positioned therein, and disposed such that it is in communication with the target and gasses within the chamber. The target material 260 is mounted adjacent a rotating magnet assembly 280 which includes a magnet array to produce a magnetic field to penetrate the target material 260 and form an arc over its surface facing the substrate 110. A rotation motor 300 causes the rotating magnet assembly to rotate about an axis of rotation with respect to the target 260. The magnetic field generated across target 260 helps to confine free electrons near the surface of the target. The increased concentration of ions excited by these electrons at the target surface increases the efficiency of the sputtering process. The pressure within the chamber can be regulated with pressure regulators 240, 250 and throttle valve 270. An RF power supply 235 applies a bias voltage to the substrate platen 115 to control tensile film stress.

Figure 3:
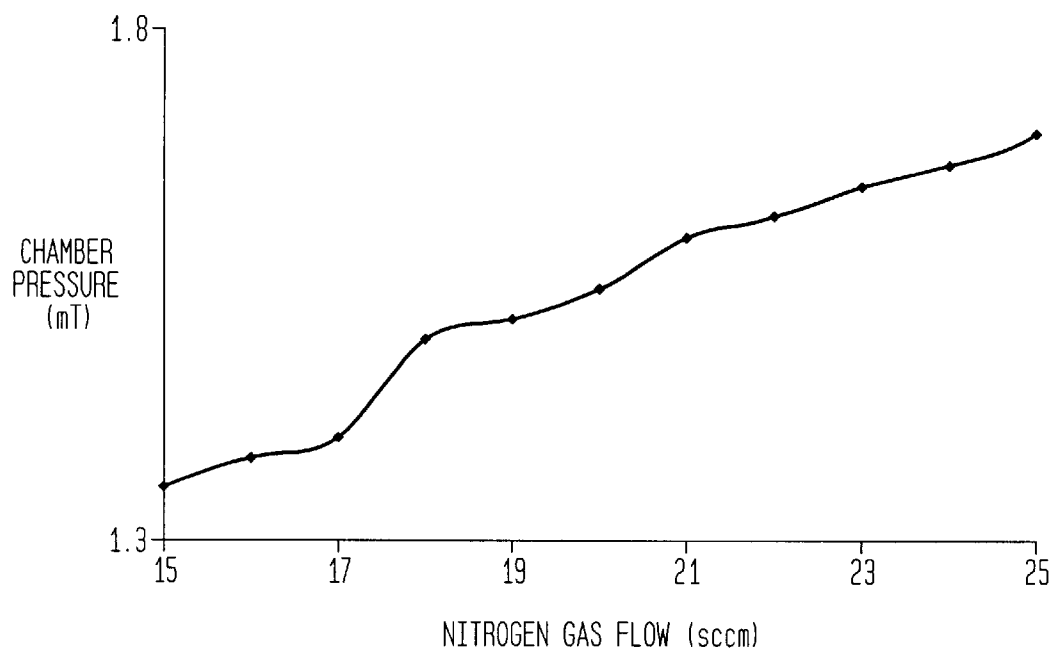
FIG. 3 is a representative graph illustrating determination of the cross-over point for AlN.
Figure 4:
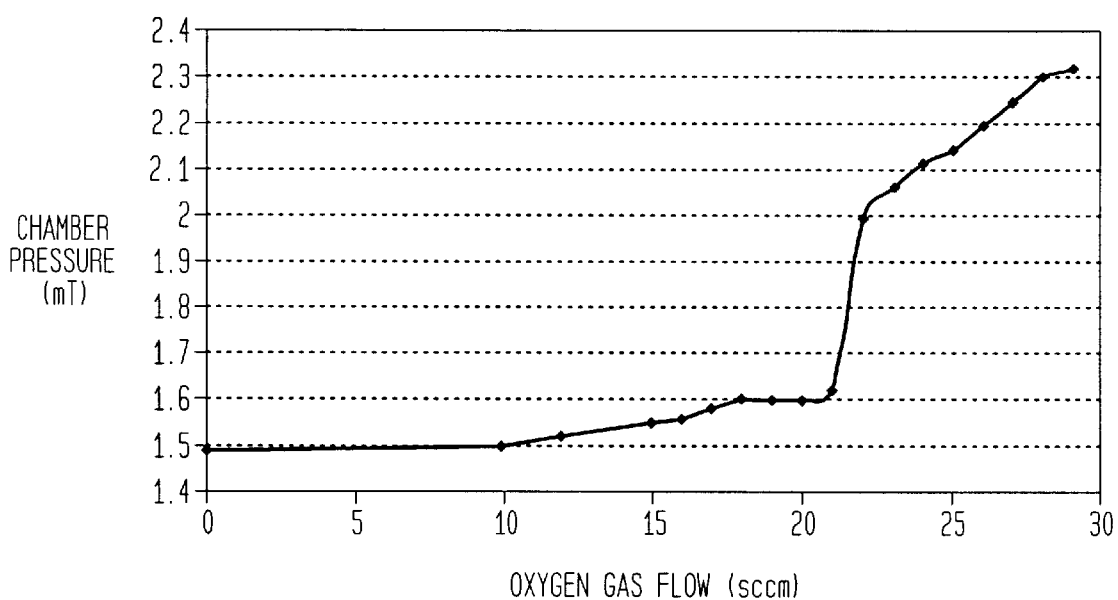
FIG. 4 is a representative graph illustrating determination of the cross-over point for $SiO_2$.

A high-quality film may be achieved with this apparatus, and various parameters can be applied to optimize the processing conditions. Applicants have discovered a method comprising optimization of the reaction parameters to achieve a high-deposition rate and correct index of refraction. The method includes a step of determining the "cross-over point" in the process. The "cross-over point" is defined as the point at which a pressure increase in the chamber 210 becomes non-linear with the flow of reactive gases, and this point reflects a reactive gas flow rate that strongly effects a reaction with the target material. For example, FIG. 3 is a representative graph illustrating determination of the cross-over point in a process involving fabrication of an AlN piezoelectric film, in which the reactive gas comprises nitrogen and the target comprises aluminum. FIG. 4 is a representative graph illustrating determination of the cross-over point in a process involving fabrication of an $SiO_2$ layer, in which the reactive gas comprises oxygen and the target comprises silicon.

Referring to FIG. 3, the characteristic pressure-flow curve shows two asymptotic regimes. At low flow of reactive gas (to the left of the graph), all the nitrogen is being reacted with metallic aluminum so introduction of small amounts of nitrogen does not increase the chamber pressure. As the gas flow is increased, gas is present in the chamber that cannot react with metal, and the unreacted gas causes an increase in pressure in the chamber. At a very high flow rate (to the right of the graph), the target material becomes filly "poisoned" or coated with the reaction product (AlN) such that any further gas admitted into the chamber will not react with target material and will directly contribute to a pressure increase. The plot of pressure versus reactive gas flow (as in FIGS. 3 and 4) shows a "cross-over curve" from the behavior of a metallic target fully consuming reactive gas to the behavior of a fully poisoned target showing increasing pressure with further admission of reactive gas.

Figure 5:
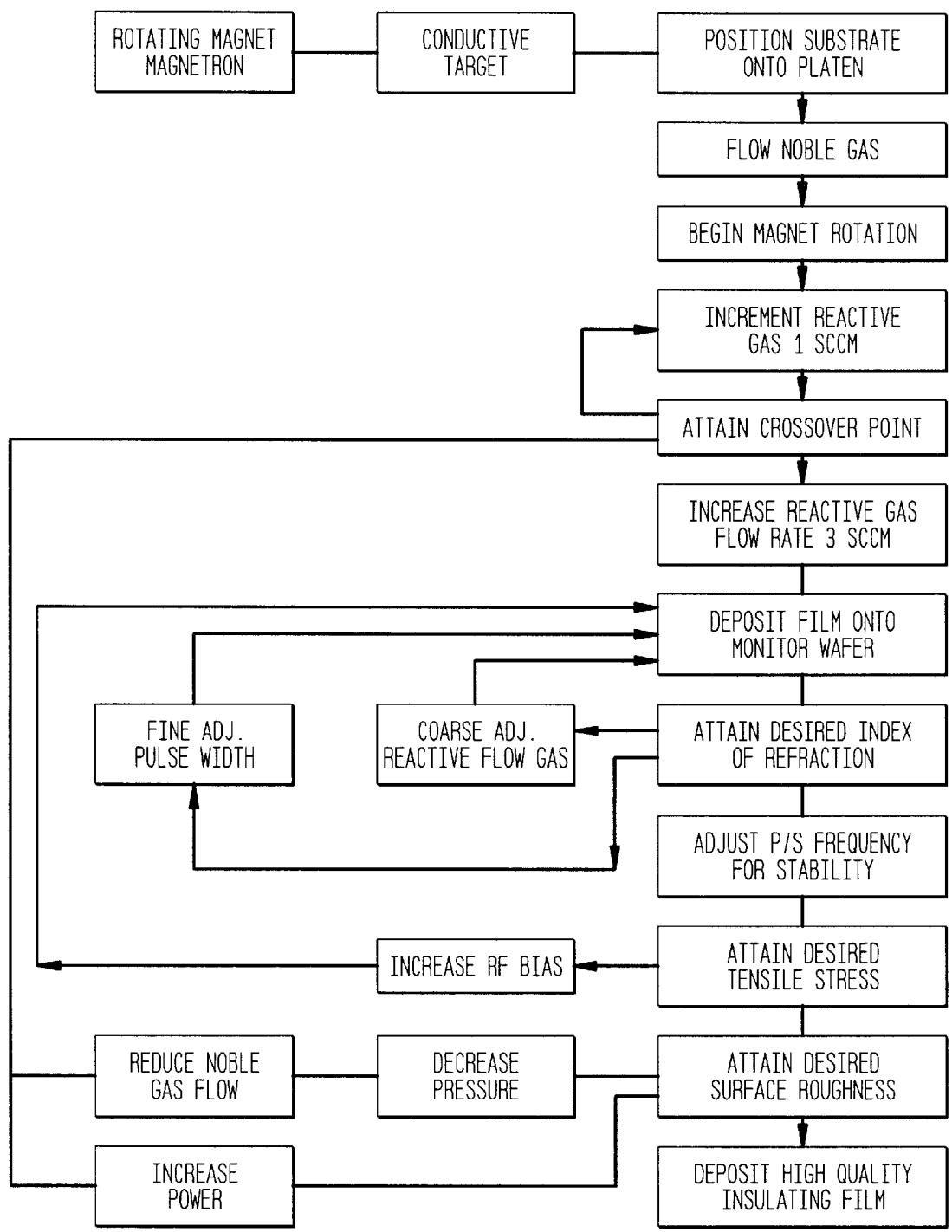
FIG. 5 is a block diagram showing steps for performing an exemplary inventive method.

FIG. 5 is a block diagram showing illustrative steps of one aspect of the invention. The invention comprises use of the cross-over curve in optimizing the reactive sputtering deposition process with use of rotating magnet magnetrons and pulsed DC power. The method includes a step of providing the target material within a sputtering chamber, with the target material being oriented on a rotating magnet assembly for producing a magnetic field across the target material. A substrate within the sputtering chamber in open communication with the target, and a pair of electrodes (target and anode ring) are positioned within the sputtering chamber. As the process begins, the magnet rotation begins and is stabilized at a level sufficient to achieve uniform target erosion. A suitable rotation speed is 282 rpms. The cross-over point for the flow of a reactive gas into the sputtering chamber is determined with appropriate settings to the pulse frequency and pulse width. The noble gas is introduced into the sputtering chamber, and then the reactive gas is added so that it reacts with a portion of the target material. The reactive gas is introduced incrementally into the sputtering chamber so that the flow rate of the reactive gas is maintained at a rate corresponding substantially to, but greater than, the flow rate at the cross-over point. A film is thus deposited on the substrate as the chamber is maintained just above the cross-over point. Immediately below (less than 3 sccm) the cross-over point will result in a metallic film. Above the cross-over point, the deposition rate decreases for at least 20 sccm and until the target is totally poisoned, becomes an insulator, and a plasma can no longer be maintained.

As the deposition process is carried out, a pulsed DC voltage is applied across the pair of electrodes (the target and anode ring) that are positioned within the sputtering chamber so that ions from the noble gas impinge upon the target material and eject atoms therefrom. Freed atoms of the target material react mostly at the target with the reactive gas to form a coating on the substrate. Maintaining the flow rate near the cross-over point is effective in optimizing the deposition conditions; the target will continue to be conductive while depositing a coating on the substrate, and poisoning of the target itself is controlled. Additionally, various other aspects of the process may be managed to improve the deposition rate and overall quality of the deposited films. For example, the relevant parameters of the process may be monitored and adjusted, considering that the deposition rate is inversely proportional to the amount of reactive gas, the power supply pulse width, and the deposition pressure, and is directly proportional to the power. The deposition rate is unaffected by the power supply frequency. The index of refraction is inversely proportional to both the amount of reactive gas and the power supply pulse width.

According to one aspect of the invention, these deposition parameters may be adjusted to achieve an optimal deposition rate for producing substantially stress-free piezoelectric films having the desired index of refraction. Using monitor wafers, the index of refraction of the deposited coating can be monitored and adjusted to achieve a desired index of refraction for the coating. This may comprise a coarse adjustment with reactive gas, followed by a fine tuning with pulse width. The current and/or voltage can be monitored and frequency adjusted to achieve a stable waveform. The pulse width of the DC voltage can be adjusted to improve the homogeneity of the film or coating formed on the substrate. The DC power can be increased or the pressure or flow rate reduced to improve the surface roughness for the film.

The inventive process is advantageous for depositing piezoelectric films and also for optimizing the processing conditions for depositing the insulating layers, which will impact upon the texture of the piezoelectric films deposited thereon. As applied to the insulating layers, additional parameters to consider are that a reduction in the surface roughness of the resultant $SiO_2$ films is achieved by increasing the power and/or decreasing the pressure. According to the invention, these parameters may be adjusted and optimized to achieve the highest deposition rate that produces films having the desired surface roughness and index of refraction. Applying this evaluative process, films may be consistently produced that have the desired index of refraction and a surface texture of less than 25 Å (RMS), and more preferably less than 10 Å.

Applying the realization that the piezoelectric film quality can be improved by providing a good starting platform for the piezoelectric film (i.e., by providing an underlying insulating layer having a relatively smooth surface texture), the surface roughness of the insulating layer may be measured and if necessary, further processed to achieve optimal quality piezoelectric films. The surface roughness of an $SiO_2$ film may be non-destructively measured by an Acoustic Force Microscope (AFM) located within the silicon laboratory in which the piezoelectric device is produced, e.g., a class 10 clean room where all silicon fabrication takes place or other Silicon Fabrication Research Laboratory (SFRL). In other words, the surface roughness of the insulating layer is measured in-situ during the fabrication. Further smoothing can be achieved by chemical mechanical polishing and to a lesser extent with a hydrogen hot sputter etch process (HSE) (a patent on this process was filed in the United Kingdom by Trikon Technologies Inc. The Trikon process teaches a flow rate of hydrogen at 50 sccm. However, applicants have discovered that a reduction in the flow rate of hydrogen gas provides significant advantages in producing films having the desired texture. For example, a reduction in hydrogen flow rate to 25 sccm (from the Trikon 50 sccm flow rate) has resulted in an improved surface smoothing capability that does not impact upon the overall thickness of the $SiO_2$ film.

The following examples will serve to further typify the nature of the invention but should not be construed as a limitation on the scope thereof, which is defined by the appended claims.

EXAMPLE 1

Deposition of an AlN Film

In operation, a first step comprises determining the cross-over curve on a monitor wafer. This can be accomplished by arbitrarily setting the pulse frequency at 100 kHz and the pulse width at 25 nS.

Next, argon (the noble gas) is introduced into the chamber, preferably at the lowest value at which a plasma can be maintained. A suitable flow rate for Ar is 20 sccm and a resultant chamber pressure of 1.5 mTorr. Initially, the nitrogen is introduced incrementally (e.g., in 1 sccm steps), as the voltage, current and chamber pressure are monitored to determine the flow rate that corresponds to the cross-over point. (Any one of the voltage, current, or chamber pressure plotted against flow rate will indicate the cross-over point; any one of these factors may be analyzed, or all three may be analyzed for confirmation.) Nitrogen (the reactive gas) is introduced into the chamber at a flow rate that corresponds substantially to (e.g., about 3 sccm above) the flow rate at the cross-over point, i.e., the point at which the target becomes nitrided.

The film is then deposited at a gas ratio approximately 3 sccm greater than the cross-over point. The stress and index of refraction of the deposited material are measured. The voltage-current of the magnetron should be monitored and if necessary, the frequency should be adjusted to achieve a stable waveform. The frequency does not affect the film quality and may be freely adjusted.

The amount of reactive gas and power supply pulse width are adjusted to achieve the desired index of refraction. The gas ratios may be varied to make coarse corrections. The reverse-bias pulse width may be adjusted for fine-tuning correction of the index—the more the pulse width is increased (that is, the larger percentage of the selected frequency it covers), the higher the index will be, but increasing the pulse width also lowers the deposition rate.

RF bias is applied to the substrate to control tensile stress. Monitor wafers are used to determine the bias that results in zero±fifty MPa stress when the index is fine tuned. The system should be monitored and corrected for zero stress when the index is fine-tuned.

The pulsed DC power may be adjusted as described in the above-referenced Miller application, incorporated herein, to enhance the desired film constituency, stress, and texture through more efficient reaction by the reactive gasses. Each power change requires re-optimization of the index of refraction and stress.

EXAMPLE 2
Deposition of a Silicon Dioxide Insulating Film

A silicon dioxide ($SiO_2$) film may be fabricated using a silicon target doped with $\leq 2\%$ boron. Oxygen is used as the reactive gas to oxidize the silicon target and form the $SiO_2$. As with the AlN deposition, a first step in the insulating layer deposition comprises determining the cross-over point on a monitor wafer. The initial pulse frequency is arbitrarily set at 100 kHz, the pulse width at 25 nS, and the argon flow adjusted to 30 sccm. Oxygen gas is added in 1 sccm steps while the voltage, current and chamber pressure are recorded. The flow rate is maintained at a gas ratio of approximately 3 sccm greater than the cross-over point. A film is deposited onto a new monitor wafer and the index is measured. Stress is ~125 MPa (±25 MPa) compressive and cannot be corrected using RF bias or chamber pressure. Accordingly, the stress level may be addressed by controlling the AlN stress (i.e. leaving AlN at 100 MPa tensile stress). The voltage-current of the magnetron should be monitored and if necessary, the frequency should be adjusted to achieve a stable waveform. The frequency does not affect the film quality and may be freely adjusted.

The amount of reactive gas and power supply pulse width are adjusted to achieve the desired index of refraction. The gas ratios may be varied to make coarse corrections. The reverse-bias pulse width may be adjusted for fine-tuning correction of the index—the more the pulse width is increased (that is, the larger percentage of the selected frequency it covers), the higher the index will be, but increasing the pulse width also lowers the deposition rate.

Next, the surface roughness is measured and the power and pressure adjusted until the desired surface roughness is achieved; the surface roughness of the resultant $SiO_2$ film improves with increasing power and decreasing pressure. A deposition power of 2 kW and a 30/28 sccm $Ar/O_2$ ratio should result in a film having a surface roughness of less than 15 Å (RMS). A surface roughness of 15 Å can be improved to less than 10 Å using the HSE. Roughness greater than 20 Å needs CMP to improve to less than 10 Å. An advantageous aspect of the invention comprises the ability to measure the $SiO_2$ surface morphology and improve this surface to less than 10 Å prior to the deposition of the piezoelectric layer, which reduces the cost of piezoelectric film fabrication. Previous fabrication methods have required X-ray diffraction after the piezoelectric film deposition which destroys the wafer. Present mask designs implement select areas of the wafer for X-ray diffraction but these cannot be invoked until the processing and deposition of the piezoelectric film is complete.

It is understood that the embodiments described herein are merely exemplary and that a person skilled in the art may make variations and modifications without departing from the spirit and scope of the invention. All such variations and modifications are intended to be included within the scope of the appended claims.

We claim:

1. A method for use in fabricating a piezoelectric film deposited on at least one insulating layer having a thickness characterized by a thickness uniformity and a surface characterized by a surface roughness comprising determining the surface roughness of the at least one insulating layer and, before the piezoelectric film is deposited, achieving a surface roughness for the insulating layer of less than 10 Å (RMS).

2. The method of claim 1 in which at least one metal layer is deposited between the insulating layer and the piezoelectric film.

3. The method of claim 1 comprising a reactive sputtering process using rotating magnet magnetrons and pulsed DC power in depositing the at least one insulating layer for promoting the thickness uniformity of the at least one insulating layer.

4. The method of claim 1 comprising a reactive sputtering process using rotating magnet magnetrons and pulsed DC power in depositing the piezoelectric film for promoting the thickness uniformity of the piezoelectric film.

5. The method of claim 1 comprising a reactive sputtering process in which a target material and a substrate are disposed within a sputtering chamber and a reactive gas is introduced into the chamber, the sputtering process including a flow of reactive gas into the sputtering chamber, the flow characterized by a cross-over point, wherein the process further comprises the steps of:

determining the cross-over point for the flow of a reactive gas into the sputtering chamber; and introducing a reactive gas into the sputtering chamber, wherein the reactive gas reacts with a portion of said target material, the reactive gas being introduced into the sputtering chamber at a flow rate corresponding substantially to the flow rate at the cross-over point.

6. The method of claim 1 in which the surface roughness of the at least one insulating layer is non-destructively measured in situ by an acoustic force microscope.

7. The method of claim 1 in which the desired surface roughness is achieved with use of chemical mechanical polishing or a hydrogen hot sputter etch process.

* * * * *